United States Patent
Zimmer

(10) Patent No.: US 6,703,920 B2
(45) Date of Patent: Mar. 9, 2004

(54) DEVICE AND METHOD FOR CONTACTLESS TRANSMISSION OF POWER OR DATA

(75) Inventor: Herbert Zimmer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/223,510
(22) Filed: Aug. 19, 2002

(65) Prior Publication Data
US 2003/0006880 A1 Jan. 9, 2003

Related U.S. Application Data

(63) Continuation of application No. 09/198,888, filed on Nov. 24, 1998, now abandoned, which is a continuation of application No. PCT/DE97/00913, filed on May 5, 1997.

(30) Foreign Application Priority Data

May 24, 1996 (DE) .......................................... 196 21 076

(51) Int. Cl.[7] ................................................. H04Q 1/00
(52) U.S. Cl. ................... 340/10.34; 340/10.4; 455/265; 334/56
(58) Field of Search ................................. 455/265, 258, 455/195.1; 334/55, 56; 340/10.4, 10.34

(56) References Cited

U.S. PATENT DOCUMENTS

| 3,629,743 A | 12/1971 | Berney |
| 3,959,746 A | 5/1976 | Straw |
| 4,972,509 A | 11/1990 | Maejima |
| 5,065,121 A | 11/1991 | Ghadaksaz |
| 5,111,186 A | 5/1992 | Narlow et al. |
| 5,953,642 A | 9/1999 | Feldtkeller |

FOREIGN PATENT DOCUMENTS

| DE | 31 20 196 C2 | 2/1985 |
| DE | 38 10 702 C2 | 1/1992 |
| DE | 43 32 798 A1 | 3/1995 |
| DE | 195 18 106 A1 | 11/1995 |
| EP | 0 676 860 A2 | 10/1995 |
| WO | WO 96/13792 | * 5/1996 |

OTHER PUBLICATIONS

"Digital geht's besser", Thomas Klemm et al., Elektronik 17, 1995, pp. 90–93.

* cited by examiner

Primary Examiner—Brian Zimmerman
(74) Attorney, Agent, or Firm—Laurence A. Greenberg; Werner H. Stemer; Ralph E. Locher

(57) ABSTRACT

A device and a method for contactless transmission of data or power include an impedance which is connected into an LC resonant circuit only in a phasewise manner, in order to match a resonant frequency of the resonant circuit to an excitation frequency. This is realized by measuring a difference between the resonant frequency and the excitation frequency and connecting the impedance into the resonant circuit as a function thereof in a manner controlled by a charging current. In this case the charging current is phase-gating-controlled, and consequently only an effective component of the impedance is connected into the resonant circuit.

6 Claims, 3 Drawing Sheets

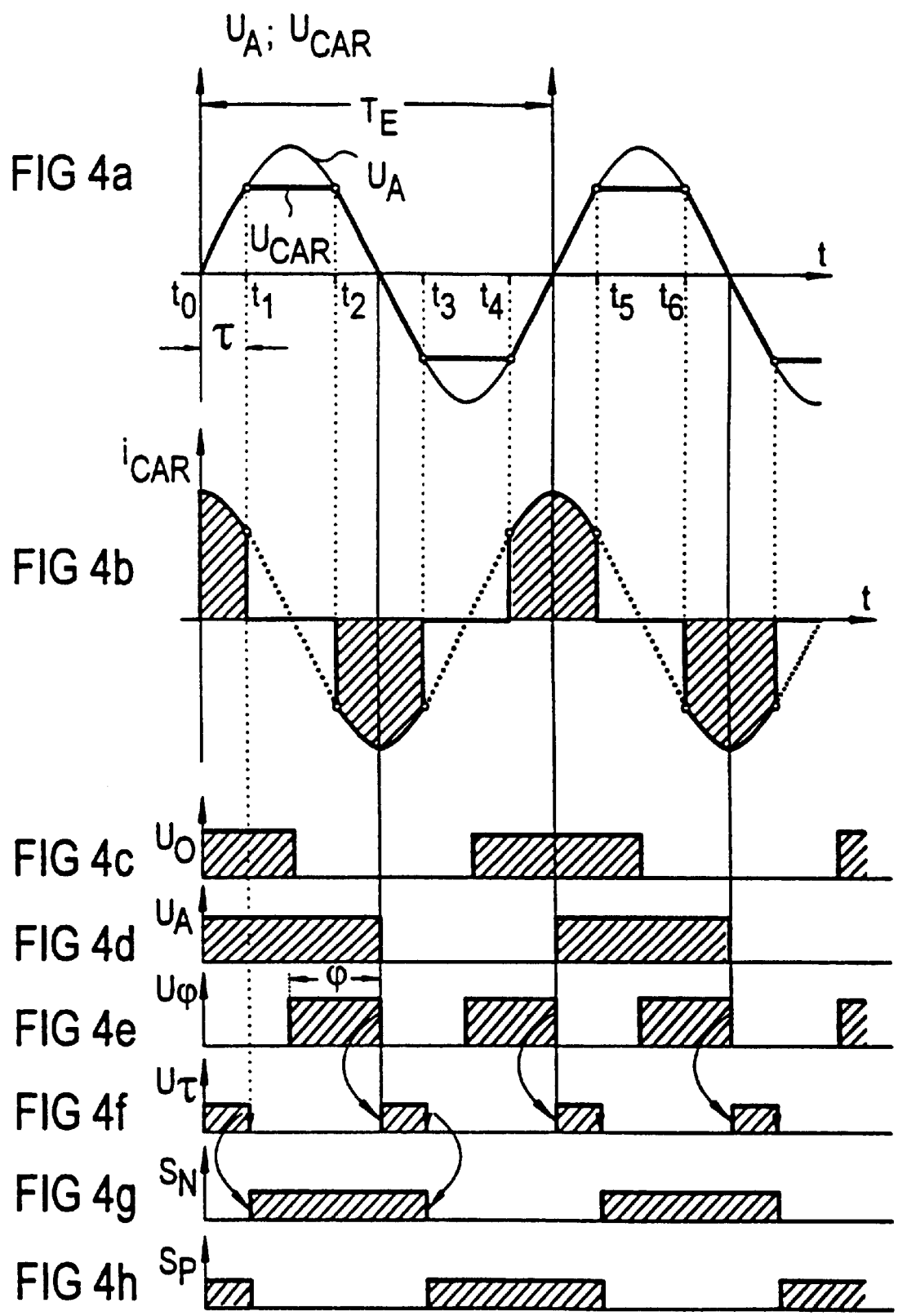

1
DEVICE AND METHOD FOR CONTACTLESS TRANSMISSION OF POWER OR DATA

CROSS-REFERENCE TO RELATED APPLICATION

This application is a continuation of U.S. application Ser. No. 09/198,888 now abandoned, filed Nov. 24, 1998 which was a continuation of International Application No. PCT/DE97/00913, filed May 5, 1997, which designated the United States, and which was not published in English.

BACKGROUND OF THE INVENTION

FIELD OF THE INVENTION

The invention relates to a device and a method for contactless transmission of power or data, in particular an anti-theft protection device for a motor vehicle, in which power or data are exchanged between a stationary unit in the motor vehicle and a portable transponder.

Such devices generally include a stationary unit and a portable unit (transponder) which is disposed, for example, on a smart card or a key. The stationary unit in that case communicates power or energy to the transponder, as a result of which data is sent back by the transponder. An inductively (transformer) coupled coil pair, where each coil is assigned to a respective resonant circuit in the stationary unit and in the transponder, is predominantly provided for that purpose. The data and power transmission is effected therein by a radio-frequency magnetic field by which an oscillation is excited in the other respective resonant circuit.

In that case, both the stationary unit and the transponder can transmit and receive data or power.

In the case of such devices for contactless transmission of power or data, the efficiency is known to be highest when the excitation frequency exciting the resonant circuit corresponds approximately to the resonant frequency of the resonant circuit. However, the resonant frequency of a resonant circuit may be shifted due to component tolerances and temperature influences. Tuning of the resonant circuit, that is to say of the resonant frequency, is therefore necessary.

In a device for contactless transmission of power or data which is known from German Patent DE 38 10 702 C2, the tuning of a resonant circuit is carried out by a regulating circuit through the use of which variable-capacitance diodes are switched into the resonant circuit. The capacitance of the variable-capacitance diodes is changed depending on the regulating voltage, as a result of which the total capacitance of the resonant circuit and thus the resonant frequency are changed. Continuous alteration of the resonant frequency is possible with such a device.

However, such a device enables only capacitive changes of the resonant circuit properties. Since, moreover, the depletion layer in variable-capacitance diodes assumes the function of a capacitor, only slight changing of the capacitances is possible with such a device. In addition, variable-capacitance diodes have large component tolerances. Their blocking behavior and, consequently, their capacitance are changed by the influence of temperature, as a result of which the field of application of such variable-capacitance diodes is very limited.

In a further device which is known from German Patent DE 44 38 287 C1, corresponding to U.S. patent application Ser. No. 08/847,866, filed Apr. 28, 1997, a plurality of capacitors are connected in parallel with the resonant circuit in order to match the resonant frequency to the excitation frequency. However, such a device does not enable continuous, but rather only stepwise matching of the resonant circuit.

SUMMARY OF THE INVENTION

It is accordingly an object of the invention to provide a device and a method for contactless transmission of data or power, which overcome the hereinafore-mentioned disadvantages of the heretofore-known devices and methods of this general type and in which a resonant frequency of a transmitting/receiving resonant circuit can be changed continuously and in a wide range.

With the foregoing and other objects in view there is provided, in accordance with the invention, a device for contactless transmission of power (energy) or data, comprising an impedance; a resonant or oscillating circuit generating an alternating magnetic field as a result of oscillation for transmitting power or data, or excited to oscillation by an external alternating magnetic field for receiving power or data, the resonant circuit excited to oscillation at an excitation frequency, and the resonant circuit having components determining a resonant frequency continuously altered by switching in the impedance and matched to the excitation frequency; and a timing control unit for switching the impedance into the resonant circuit only in a phasewise manner in dependence on a difference between the resonant frequency and the excitation frequency in each case within a period of the oscillation.

In accordance with another feature of the invention, the resonant circuit has a capacitor, and the impedance is a capacitor connected in parallel or in series with the capacitor of the resonant circuit.

In accordance with a further feature of the invention, the resonant circuit has a coil, and the impedance is an inductance connected in parallel or in series with the coil.

With the objects of the invention in view, there is also provided a method for contactless transmission of power or data, which comprises providing a resonant circuit generating an alternating magnetic field as a result of oscillation for transmitting power or data, or excited to oscillation by an external alternating magnetic field; determining a resonant frequency of the resonant circuit with components of the resonant circuit; continuously altering the resonant frequency by switching in an impedance and matching the resonant frequency to an excitation frequency; and switching the impedance into the resonant circuit only in a phasewise manner, with a timing control unit, in dependence on a difference between the resonant frequency and the excitation frequency in each case within a period of the oscillation, so that only part of the impedance becomes effective.

The present invention enables the resonant frequency of a resonant circuit to be altered continuously in a simple manner. In this case, the resonant circuit can be altered both capacitively and inductively through the use of an impedance which can be connected only in a phasewise manner. The impedances that are used may be capacitances or inductances having fundamental values which only vary slightly due to temperature influences, as compared with semiconductor components. In addition, such impedances only have small component tolerances.

Other features which are considered as characteristic for the invention are set forth in the appended claims.

Although the invention is illustrated and described herein as embodied in a device and a method for contactless transmission of power or data, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4a to 4h are graphs of signal diagrams of the circuit configuration according to FIG. 3.

DESCRIPTION OF THE PREFERRED EMBODIMENTS

Figure 1:
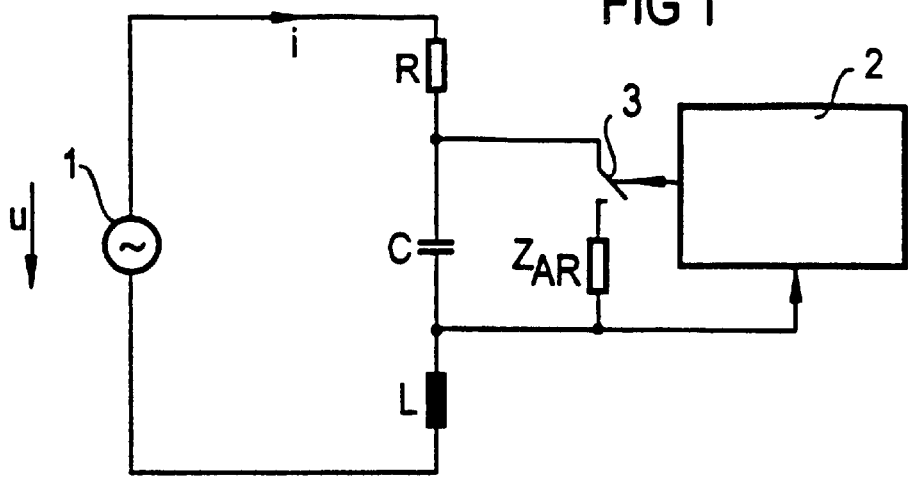
FIG. 1 is a schematic and block circuit diagram of a device according to the invention.

Referring now to the figures of the drawings in detail and first, particularly, to FIG. 1 thereof, there is seen an inventive device for contactless transmission of power or data which has an LC resonant circuit (series resonant circuit or parallel resonant circuit) including a resistor R, a capacitor C and a coil L. The resonant circuit is excited to oscillation by a generator or oscillator 1 with an excitation frequency $f_E$.

An alternating magnetic field for transmitting power or data is generated by such oscillation. Moreover, such a resonant circuit can also be excited to oscillation by an external alternating magnetic field, as a result of which power or data is are received externally.

Every resonant circuit has a natural frequency, which is also called a resonant frequency $f_R$, that is determined by the inductance of the coil L and the capacitance of the capacitor C of the components of the resonant circuit which are used (total impedance):

$$f_R = \sqrt{\frac{1}{LC}}$$

In a series or parallel resonant circuit, the resonant frequency $f_R$ is essentially determined by the inductance of the coil L and by the capacitance of the capacitor C. The resistor R has essentially no influence on the resonant frequency $f_R$. For this reason, the resistor R is ignored in the following consideration.

In order to transmit power or data, the resonant circuit is made to oscillate at the excitation frequency $f_E$ by the oscillator 1 which has an excitation parameter. The excitation parameter being used may be an output voltage u or an output current i of the oscillator 1. A non-illustrated frequency divider may additionally be disposed between the oscillator 1 and the resonant circuit. The frequency divider divides the oscillator frequency down to the desired excitation frequency $f_E$.

The generated oscillation intensity (amplitude) of the signal to be transmitted or of the received signal is known to be highest when the resonant circuit is excited with an excitation frequency $f_E$ that is equal to the resonant frequency $f_R$. This applies both to the transmission and to the reception of power or data. If the excitation frequency $f_E$ of the received oscillation differs from the resonant frequency $f_R$ of the resonant circuit, then the received intensity decreases.

The resonant frequency $f_R$ of the resonant circuit may be shifted relative to the desired resonant frequency $f_R$ due to component tolerances, aging of components or temperature influences. Optimum conditions for the transmission and reception of data or power are achieved when the resonant frequency $f_R$ corresponds approximately to the excitation frequency $f_E$. For this purpose, the invention provides for the impedance of the resonant circuit to be altered by continuously switching-in a tuning impedance $Z_{AR}$ in such a way that the resonant frequency $f_R$ is matched to the excitation frequency $f_E$.

For this purpose, detuning, that is to say the difference between the excitation frequency $f_E$ and the resonant frequency $f_R$, is measured and, as a function thereof, the tuning impedance $Z_{AR}$ is effectively switched into or out of the resonant circuit at specific time intervals, that is to say only in a phasewise manner, through the use of a timing control device 2 and a switch 3. In this case the effective magnitude of the tuning impedance $Z_{AR}$ which is controlled in this way is steplessly variable and determined in such a way as to produce a new resonant frequency $f_R$ that is matched to the excitation frequency $f_E$. The resonant circuit can also be adjusted to a fixedly predetermined degree of detuning with the aid of the control device 2.

Figure 2A:
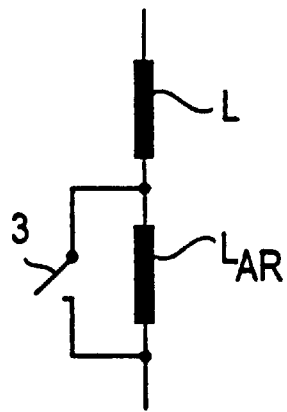
FIGS. 2a to 2d are schematic diagrams showing exemplary embodiments of the device according to FIG. 1.
Figure 2B:
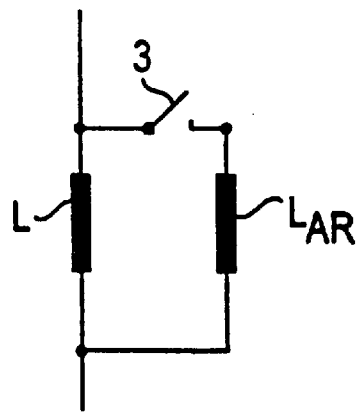
Figure 2C:
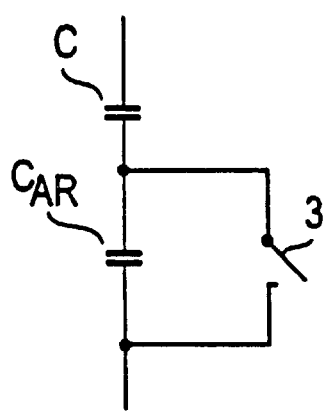
Figure 2D:
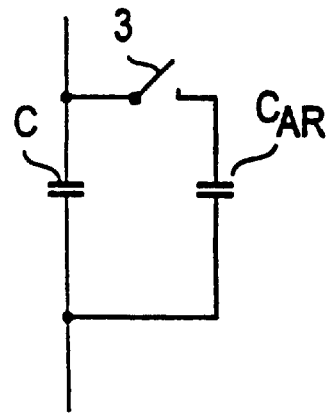

FIGS. 2a to 2d illustrate different possibilities for varying the total impedance of the resonant circuit through the use of the tuning impedance $Z_{AR}$. Thus, a tuning coil $L_{AR}$ can be disposed in series with the coil L as shown in FIG. 2a or in parallel with the coil L as shown in FIG. 2b. It is equally possible for a tuning capacitor $C_{AR}$ to be disposed in series with the capacitor C of the resonant circuit as shown in FIG. 2c or in parallel with the capacitor C of the resonant circuit as shown in FIG. 2d.

For example, in the exemplary embodiment according to FIG. 2d, an effective capacitance $C_{AReff}$ of the tuning capacitor $C_{AR}$, which is achieved due to only phasewise driving of the tuning capacitor $C_{AR}$, can be determined in a simple manner with the aid of a Fourier analysis of the current flowing through the tuning capacitor $C_{AR}$. In this case a resulting total capacitance $C_{Res}$, which determines the resonant frequency $f_R$, is calculated to be:

$$C_{Res} = C_{AReff} + C$$

However, in these variation possibilities (FIGS. 2a to 2d), additional switching elements which are necessary, for example, for switching an inductance or capacitance, are not taken into consideration. Such additional switching elements are freewheeling diodes, for example. However, these additional switching elements are of no significance to the invention.

The invention is explained in more detail below using an exemplary embodiment in which a tuning capacitor $C_{AR}$ as illustrated in FIG. 2d, is disposed as a tuning impedance $Z_{AR}$ in parallel with the capacitor C of the resonant circuit.

Figure 3:
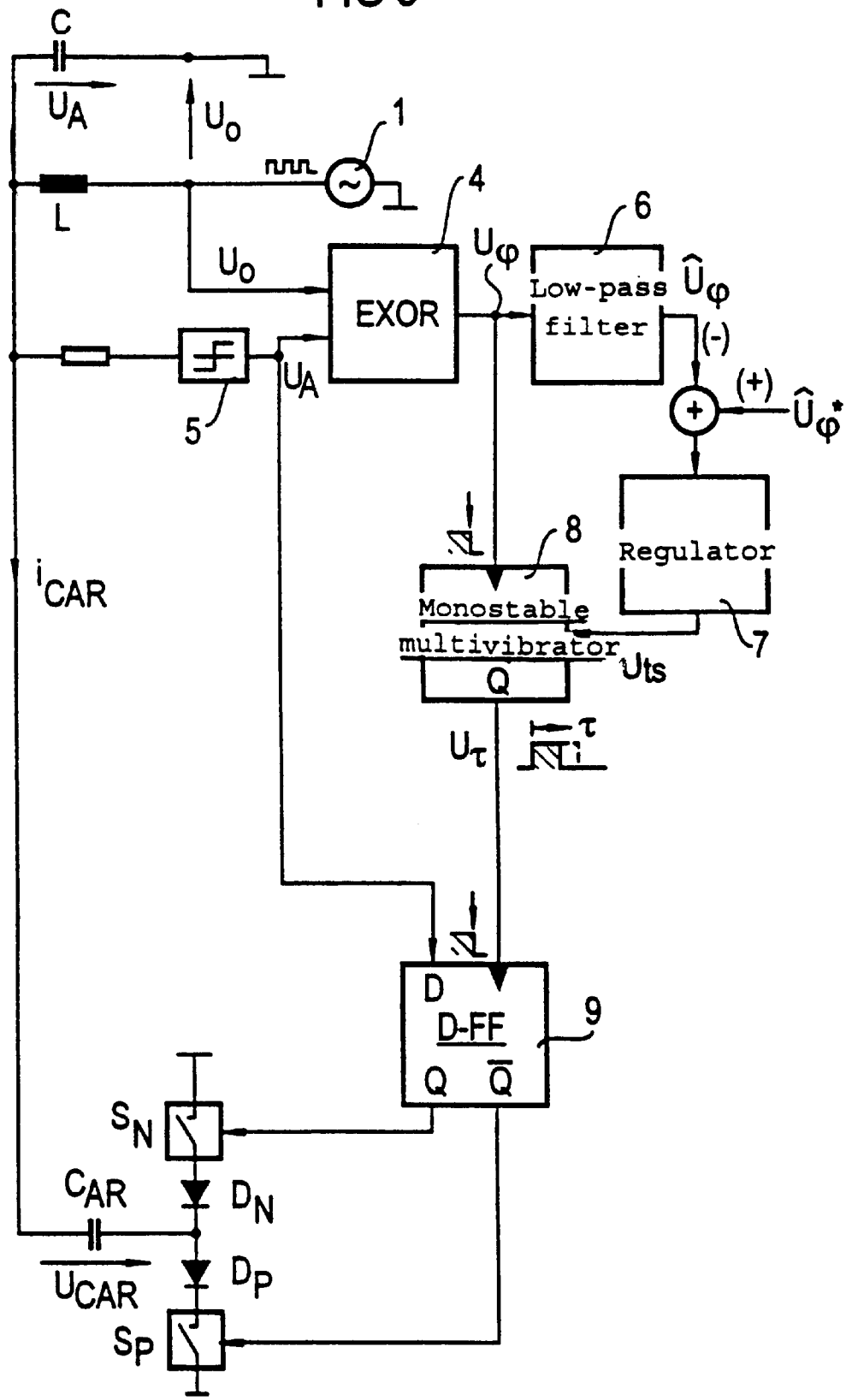
FIG. 3 is a schematic and block circuit diagram of a circuit configuration (equivalent circuit diagram) for altering a resonant frequency of a resonant circuit.

FIG. 3 illustrates an exemplary embodiment of a circuit configuration with which the tuning impedance $Z_{AR}$ can be switched into or out of the resonant circuit in a continuously variable manner and controlled with respect to time. The resonant circuit, which essentially includes the coil L and the capacitor C, is excited to oscillation by the oscillator 1 which has the excitation frequency $f_E$. The oscillator 1 in this case generates a square-wave oscillation at the fixed excitation frequency $f_E$.

Depending on the components, that is to say the coil L and the capacitor C, as well as on the quality factor of the resonant circuit, a resonant circuit voltage $U_A$ (see FIG. 4a as well) having a specific oscillation amplitude and a phase with respect to the phase of an oscillator voltage $U_o$, is established between the coil L and the capacitor C. The amplitude and the phase of the resonant circuit voltage $U_A$ in this case depend on the detuning of the resonant circuit, that is to say on the difference between the excitation frequency $f_E$ and the resonant frequency $f_R$.

If the resonant frequency $f_R$ is equal to the excitation frequency $f_E$ (which is referred to below as the resonance case), then the phase of the resonant circuit voltage $U_A$ lags by 90° relative to the phase of the oscillator voltage $U_o$ due to the phase shift by the coil L. This is independent of the quality factor of the resonant circuit.

The oscillator voltage $U_o$ is tapped directly on the oscillator 1 and fed as a reference value to an EXOR gate 4 (see FIG. 4c). Likewise, the resonant circuit voltage $U_A$ is tapped between the coil L and the capacitor C, digitized through the use of a Schmitt trigger 5 and likewise fed to the EXOR gate 4 (see FIG. 4d). As a result, the phase of the oscillator voltage $U_o$ is compared with the phase of the resonant circuit voltage $U_A$ in order to ascertain their phase difference and the resultant difference between the resonant frequency $f_R$ and the excitation frequency $f_E$.

A phase signal $U_\Phi$ (see FIG. 4e) having a phase $\Phi$ and an amplitude $\hat{U}_\Phi$ (DC voltage component after a low-pass filter 6) is available at an output of the EXOR gate 4. The phase signal $U_\Phi$ is dependent on the phase shift $\Phi$ between the resonant circuit voltage $U_A$ and oscillator voltage $U_o$. The phase signal $U_\Phi$ has a frequency f which corresponds to twice the excitation frequency $f_E$ ($f=2f_E$).

A measured DC voltage component $\hat{U}_\Phi$ and a predetermined desired value signal $\hat{U}_{\Phi^*}$ (reference value) which corresponds to a DC voltage, wherein the amplitude thereof corresponds to the amplitude $\hat{U}_\Phi$ in the resonance case, are fed to a regulator 7. The regulator 7 generates a regulation signal $U_{ts}$ at its output and with this signal controls an edge-triggered monostable multivibrator 8, which establishes a control signal $U_\tau$ (see FIG. 4f) with control pulses having a duration $\tau$.

The monostable multivibrator 8 is started with each falling edge of the phase signal $U_\Phi$, that is to say upon each zero crossing of the resonant circuit voltage $U_A$ (see FIG. 4a). The control signal $U_\tau$, which clocks a D-type flip-flop 9 with its falling edge, is present at the output of the monostable multivibrator 8. The digitized resonant circuit voltage $U_A$ which is applied to a D input of the D-type flip-flop 9 is used for determining the states of outputs Q and $\overline{Q}$ of the D-type flip-flop 9 (see FIGS. 4g and 4h), at the instant of a falling edge of the control signal $U_\tau$.

The outputs Q and $\overline{Q}$ of the D-type flip-flop 9 are connected to switches $S_N$ and $S_P$, through the use of which the tuning capacitor $C_{AR}$ is switched in or out through diodes DN and DP, with respect to ground and, consequently, with respect to the resonant circuit.

The method according to the invention is explained in more detail below with reference to FIGS. 4a to 4h. In this case, FIG. 4a illustrates the resonant circuit voltage $U_A$ (thin curve in FIG. 4a) and the tuning voltage $u_{CAR}$ (bold curve in FIG. 4a) present across the tuning capacitor $C_{AR}$. FIG. 4b shows the profile of the charging current $i_{CAR}$ which flows into the tuning capacitor $C_{AR}$ and thus charges it. The oscillator voltage $U_o$ and the digitized resonant circuit voltage $U_A$ are shown in FIGS. 4c and 4d, respectively. The phase signal $U_\Phi$ is illustrated in FIG. 4e and the control signal $U_\tau$ is illustrated in FIG. 4f. FIGS. 4g and 4h show control pulses for the switches $S_N$ and $S_P$, respectively.

At an instant $t_0$, the switch SP is assumed to be closed. The tuning capacitor $C_{AR}$ is thus connected in parallel with the capacitor C of the resonant circuit. The voltage $u_{CAR}$ across the tuning capacitor $C_{AR}$ follows the resonant circuit voltage $U_A$ until an instant $t_1$ (which corresponds to the duration $\tau$ seen in FIGS. 4a and 4f). The tuning capacitor $C_{AR}$ is then charged to the voltage $\hat{U}_A \cdot \sin(2\pi f_E \cdot \tau)$. Changing over the switches $S_N$ and $S_P$ ($S_N$ is switched on and $S_P$ becomes open) after the duration $\tau$ (at the instant $t_1$) prevents further charging of the tuning capacitor $C_{AR}$ since the diode $D_N$ blocks when the resonant circuit voltage $U_A$ is greater than the tuning voltage $u_{CAR}$. Since the charge of the tuning capacitor $C_{AR}$ then remains constant, the voltage potential at the junction increases if the resonant circuit voltage $U_A$ rises further.

Since the switch $S_N$ is switched on, at an instant $t_2$ (seen in FIG. 4a) a negative charging current $i_{CAR}$ can start through the diode $D_N$ and the switch $S_N$ as soon as the resonant circuit voltage $U_A$ falls below the tuning voltage $u_{CAR}$, because then the junction between the two switches $S_N$ and $S_P$ is at ground again. The negative charging current $i_{CAR}$ is interrupted at an instant $t_3$ by renewed changeover after the duration $\tau$ after the zero crossing of the resonant circuit voltage $U_A$ (switch-off of the switch $S_N$) and, at the instant $t_4$, can start again in the positive direction through the diode $D_P$ and the switch $S_P$.

At an instant $t_5$, the charging operation is interrupted anew (switch-on of the switch $S_N$ and switch-off of the switch $S_P$) Cosine waveforms which are gated on both sides (see FIG. 4b, bold curve) are thus produced for the charging current $i_{CAR}$ that charges the tuning capacitor $C_{AR}$, with the result that the tuning capacitor $C_{AR}$ is only partially effectively switched into the resonant circuit (only its effective capacitance $C_{AReff}$ acts).

The gating width is controlled by way of the duration $\tau$. The longer the duration $\tau$ becomes, the longer the charging current $i_{CAR}$ flows. The shorter the duration $\tau$ becomes, the less charging current $i_{CAR}$ (that is to say smaller charge of the tuning capacitor $C_{AR}$) flows through the tuning capacitor $C_{AR}$ since the charging current $i_{CAR}$ is defined by the capacitance of the tuning capacitor $C_{AR}$ and the derivative of the tuning voltage $u_{CAR}$ with respect to time ($i_{CAR} = C_{AR} \cdot du_{CAR}/dt$). Inverting this reveals that the charge and thus effective capacitance $C_{AReff}$ of the tuning capacitor $C_{AR}$ is determined by the time-dependent charging current $i_{CAR}$, and thus by the duration $\tau$.

Since the duration $\tau$ is dependent on the difference between the excitation frequency $f_E$ and the resonant frequency $f_R$, the resonant circuit is consequently tuned continuously variably and automatically according to the invention. It is thus possible for the effectiveness of the tuning capacitor $C_{AR}$, and consequently the resonant frequency $f_R$, to be continually controlled by way of the duration $\tau$. Therefore, when the tuning capacitor $C_{AR}$ is switched in, its full capacitance is not effective, rather only part of it corresponding to the charging current $i_{CAR}$, as a result of which the effective capacitance $C_{AReff}$ is realized.

If the duration $\tau$ becomes longer, then the instants $t_1$ and $t_2$ as well as $t_5$ and $t_6$ lie close together, while at the same time the interval between the instants $t_0$ and $t_1$ as well as $t_4$ and $t_5$ becomes longer. Conversely, the interval between the instants $t_0$ and $t_1$ becomes shorter if the duration $\tau$ is intended to become shorter.

It will now be assumed that the resonant circuit is downwardly tuned, that is to say the sum of the capacitance of the capacitor C and the effective component of the capacitance of the tuning capacitor $C_{AR}$ will be too large. The consequence of this is that the phase of the resonant circuit voltage $U_A$ lags by more than 90° relative to the oscillator voltage $U_o$. The phase signal $U_\Phi$ produced at the output of the EXOR gate 4 has a mark-space ratio of greater than 50%. Consequently, the DC voltage component $\hat{U}_\Phi$ is greater than the reference value $\hat{U}_{\Phi*}$. The regulator 7 receives a negative regulation deviation and controls its regulation signal $U_{ts}$ in such a way that it is pulled back. The resultant duration $\tau$ becomes shorter in this way and the effective component of the tuning capacitor $C_{AR}$ is reduced with the aid of the charging current $i_{CAR}$ until the resonant frequency $f_R$ is reached.

The tuning capacitor $C_{AR}$ is thus switched into the resonant circuit by the tuning capacitor $C_{AR}$ being charged in a phase-gating-controlled manner by the charging current $i_{CAR}$. This means that the charging current $i_{CAR}$ does not flow effectively during an entire period $T_E$ of the oscillation, but rather only during a few phase sections which depend on the duration $\tau$. The tuning capacitor $C_{AR}$ is thus not charged completely, with the result that only part of its capacitance becomes effective and acts on the resonant circuit. If a tuning capacitor $C_{AR}$ having a higher total value is used, then the effective component as well as the regulation range are consequently greater. If only a small tuning capacitor $C_{AR}$ is used, then the total capacitance of the resonant circuit can only be changed in a small capacitance range.

The use of a capacitor as the tuning impedance $Z_{AR}$ has the advantage of causing a cost-effective component to serve as a tuning element for the resonant circuit. The component tolerances of the tuning capacitor $C_{AR}$ have no influence on the tuning since they can be corrected through the use of the control device 2.

When dimensioning the resonant circuit, the capacitance of the capacitor C, for example, can be dimensioned to be relatively small, with the result that part of the tuning capacitor $C_{AR}$ must always be effectively connected to the capacitor C in order to ensure that the resonant frequency $f_R$ can be adjusted. The effect achieved by this is that an adjustment range is obtained for the resonant frequency $f_R$, of the kind that would be achieved by connecting in $\pm\frac{1}{2}C_{AR}$. Therefore, the total capacitance of the resonant circuit can become larger as well as smaller.

The size of the tuning capacitor $C_{AR}$ and of the capacitor C of the resonant circuit is determined in such a way that the resonant circuit can still be reliably tuned given the component tolerances and temperature influences that are to be expected. Thus, the capacitances for $C_{AR}$ and C can be chosen in such a way that the following condition is reliably fulfilled (starting from a desired excitation frequency $f_E$ and with parallel connection of the tuning capacitor $C_{AR}$):

$$\sqrt{\frac{1}{L\cdot(C+C_{AR})}} < f_E < \sqrt{\frac{1}{L\cdot C}}$$

It is advantageous to use this device in a non-illustrated anti-theft protection device for a motor vehicle. In particular, the device according to the invention can be used in an immobilizer. For this purpose, a first resonant circuit is disposed in a lock (lock resonant circuit), preferably in the ignition lock, and is driven by an oscillator 1. In a first phase, power signals are generated which are transmitted by an alternating magnetic field through the coil of the lock resonant circuit.

A portable transponder disposed on a smart card or a key lock likewise has a resonant circuit (key resonant circuit). If the coil of the lock and the coil of the transponder are disposed close to one another, then transformer transmission of power and data takes place.

The resonant circuit of the lock transmits the power signals which excite the key resonant circuit to oscillation. This oscillation is modulated by a key-specific code information item. The radio-frequency magnetic field which is thus generated retroacts on the lock resonant circuit and excites oscillation there for its part.

The modulated oscillation that is excited in the lock resonant circuit is acquired by an evaluation unit. The code information item is demodulated therefrom, compared with a desired code information item in a comparator and, in the event of correspondence, an enable signal is transmitted to the immobilizer. The transponder thus proves its authorization to start the motor vehicle.

Inventive tuning of the resonant frequency $f_R$ can take place both in the lock resonant circuit and in the key resonant circuit, independently of one another. If the resonant frequency $f_R$ of the lock resonant circuit does not correspond to the excitation frequency $f_E$ of the oscillator 1, then the resonant frequency $f_R$ is changed according to the invention. If the resonant frequency $f_R$ of the key resonant circuit does not correspond to the frequency of the transmitted power signals, then the resonant frequency $f_R$ of the key resonant circuit is changed. Finally, if the resonant frequency $f_R$ of the lock resonant circuit then does not correspond to the frequency of the transmitted code signals, the resonant frequency $f_R$ of the lock resonant circuit can once again be altered.

Accordingly, for this purpose, the tuning capacitor $C_{AR}$ of each resonant circuit is connected into the resonant circuit in a phase-gating-controlled manner in each case. Prior to this, however, the detuning of the resonant circuit is detected by way of the phase shift between the excitation and the oscillation.

The device and the method for transmission of power or data according to the invention can also be used in further devices in which resonant circuits are used to transmit or receive signals.

The control device 2 with the regulating circuit for changing the resonant frequency $f_R$ in this case can be realized either in an analog manner or else digitally. An exemplary embodiment using analog technology is illustrated in FIG. 3. Likewise, the tuning capacitor $C_{AR}$ can be switched in or out digitally as well, under the control of a microprocessor.

The control device 2, which includes the Schmitt trigger 5, the EXOR gate 4, the low-pass filter 6, the regulator 7, the monostable multivibrator 8 and the D-type flip-flop 9, can also be constructed as an integrated circuit. Likewise, the switches $S_N$ and $S_P$ can be integrated in the form of switching transistors, as can the diodes $D_N$ and $D_P$.

All of the components in this case must have a withstand voltage of several hundred volts in some instances, since the resonant circuit voltage $U_A$ reaches a maximum amplitude of about 100 V in the event of use in an anti-theft protection system.

This device thus enables the detuning of the resonant circuit to be measured as well as automatically and continuously variably corrected in a simple manner. In addition, depending on the tuning capacitor $C_{AR}$, a large regulation range is possible since capacitors having very high capacitances can be produced simply and inexpensively.

I claim:

1. A device for contactless transmission of power or data, comprising:

an impedance;

a resonant circuit generating an alternating magnetic field as a result of oscillation for transmitting power or data, or excited to oscillation by an external alternating magnetic field for receiving power or data, said resonant circuit excited to oscillation at an excitation frequency, and said resonant circuit having components determining a resonant frequency continuously altered by switching in said impedance and matched to the excitation frequency; and a timing control unit for switching said impedance into said resonant circuit only in a phasewise manner in dependence on a difference between the resonant frequency and the excitation frequency in each case within a period of the oscillation.

2. The device according to claim 1, wherein said resonant circuit has a capacitor, and said impedance is a capacitor connected in parallel with said capacitor of said resonant circuit.

3. The device according to claim 1, wherein said resonant circuit has a capacitor, and said impedance is a capacitor connected in series with said capacitor of said resonant circuit.

4. The device according to claim 1, wherein said resonant circuit has a coil, and said impedance is an inductance connected in parallel with said coil.

5. The device according to claim 1, wherein said resonant circuit has a coil, and said impedance is an inductance connected in series with said coil.

6. A method for contactless transmission of power or data, which comprises:

providing a resonant circuit generating an alternating magnetic field as a result of oscillation for transmitting power or data, or excited to oscillation by an external alternating magnetic field;

determining a resonant frequency of the resonant circuit with components of the resonant circuit;

continuously altering the resonant frequency by switching in an impedance and matching the resonant frequency to an excitation frequency fE; and switching the impedance into the resonant circuit only in a phasewise manner, with a timing control unit, in dependence on a difference between the resonant frequency and the excitation frequency in each case within a period of the oscillation, so that only part of the impedance becomes effective.

* * * * *